United States Patent

Morris et al.

[11] Patent Number: 6,061,222
[45] Date of Patent: May 9, 2000

[54] METHOD AND APPARATUS FOR REDUCING NOISE IN INTEGRATED CIRCUIT CHIPS

[75] Inventors: Terrel L. Morris, Garland; Harold W. Dozier, Dallas, both of Tex.

[73] Assignee: Hewlett-Packard Company, Palo Alto, Calif.

[21] Appl. No.: 09/141,549

[22] Filed: Aug. 28, 1998

[51] Int. Cl.[7] ...................................................... H02H 3/22
[52] U.S. Cl. ............................ 361/111; 361/56; 257/533; 257/659
[58] Field of Search .............................. 361/113, 58, 111, 361/118, 126, 56, 91.1, 91.2, 91.7; 257/355, 358, 359, 363, 533, 659

[56] References Cited

U.S. PATENT DOCUMENTS

| | | | |
|---|---|---|---|
| 4,890,187 | 12/1989 | Tailliet et al. | 361/111 |
| 5,721,656 | 2/1998 | Wu et al. | 361/56 |
| 5,923,076 | 7/1999 | Campardo et al. | 257/533 |

*Primary Examiner*—Michael J. Sherry

[57] ABSTRACT

A method and apparatus for reducing noise in integrated circuit chips (ICs). The apparatus comprises on-die capacitance in conjunction with one or more resistive loss elements, which provide an AC termination for on-die power events. The on-die capacitance can be instantiated in metal layers alone, in gate oxides or in gate oxides combined with metal structures. The capacitance may be provided by the capacitive characteristics of adjacent metal layers of the power distribution structure of the IC. When the capacitance is provided in this manner, the resistive loss element corresponds to the linear resistance of thin lines on the metal layers of the power distribution structure. The resistive loss element may, alternatively, be comprised of a field effect transistor (FET) or a metal oxide semiconductor field effect transistor (MOSFET). By utilizing on-die capacitance in conjunction with one or more resistive loss elements, the IC is provided with loss characteristics and power filter characteristics that are effective in reducing power noise and EMI. The method ensures that the values of the resistive loss element and of the capacitance element are selected for optimum reduction of power noise without causing on-die resonance.

17 Claims, 3 Drawing Sheets

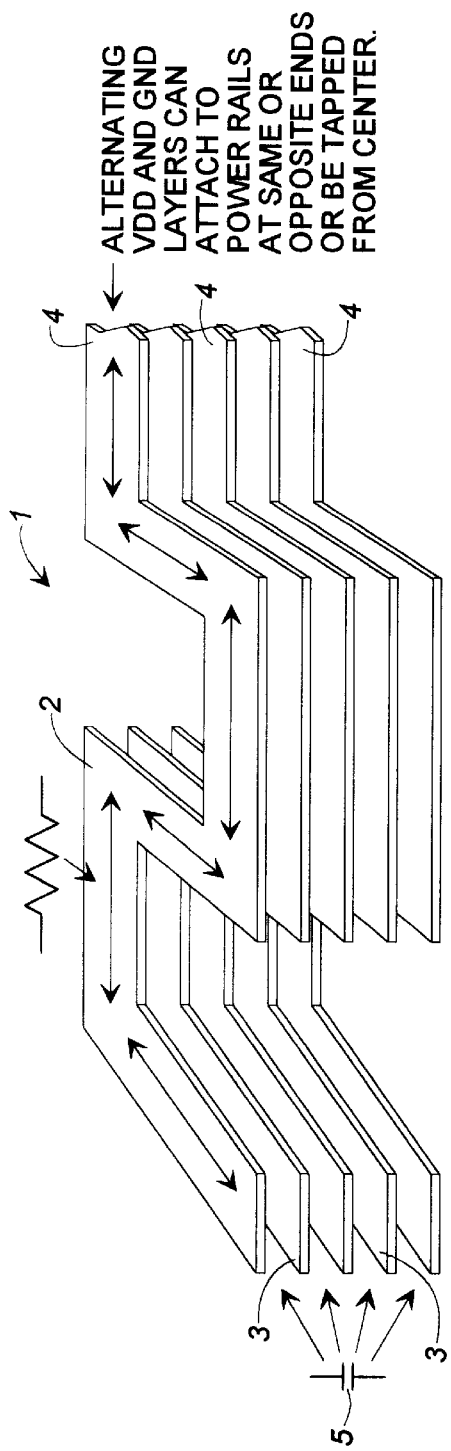
FIG. 3
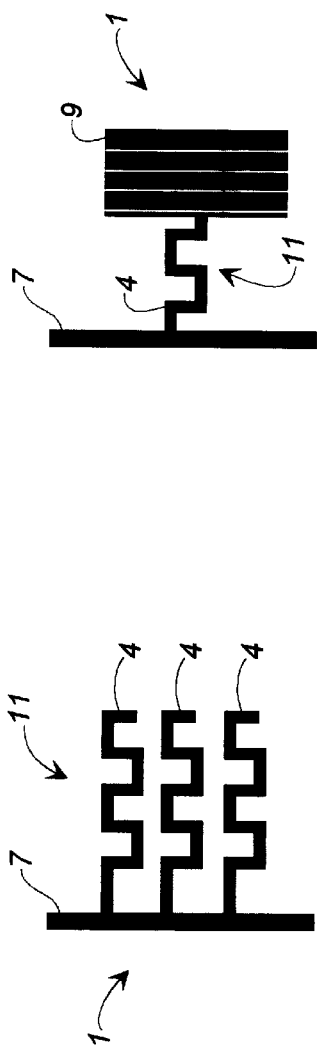
FIG. 4(A)
FIG. 4(B)

POWER        GND

METHOD AND APPARATUS FOR REDUCING NOISE IN INTEGRATED CIRCUIT CHIPS

TECHNICAL FIELD OF THE INVENTION

The present invention relates to a method and apparatus for reducing noise in integrated circuit chips (ICs) and, more particularly, to a method and apparatus for reducing power noise and EMI in ICs which utilize on-die capacitance in conjunction with one or more resistive loss elements to provide an AC termination for on-die power events.

BACKGROUND OF THE INVENTION

In high-powered ICs, such as, for example, high-powered application specific integrated circuits (ASICs), the di/dt current noise, also known as on-die power sag and brown out, can be extremely large. For example, much of the power consumed in a large CMOS IC is demanded in the first part of a clock cycle, which creates a power demand at a fundamental frequency associated with the rate of current change. This frequency is inherently different from the operating frequency of the IC due to clock distribution current demands, gate switching transients, and propagation delays through the gates, and may result in power noise in the IC which interferes with its performance as well as causing unwanted EMI.

FIG. 1 shows a typical waveform for a CMOS power noise event on die. When the clock transitions, much of the current is consumed in a small amount of time, which results in a net collapse of the on-die VDD level relative to the on-die ground. This is due to the effects of the current required to charge and discharge capacitance when switching the on-die clock distribution network, combined with the current required to switch on-die gates which have been activated by the clock.

Various techniques and designs have been used for reducing noise in ICs. One known technique utilizes on-package bypass capacitance, which is implemented using discrete capacitors. One disadvantage of this approach is that the effectiveness of the capacitors is severely limited by series inductance existing between the die (demand for charge) and the package capacitors (source of charge). As a result, the on-package capacitance provides only slightly better performance than using no capacitance at all. Furthermore, the frequency response of the network formed by the die attach, the package via inductances, the package trace and plane inductances, and the self inductance of the capacitors is not well matched to the frequency content of the incident on-die event. Consequently, the frequency response of this network is limited and is inadequate for handling the sharp peaks of the incident on-die event.

Another known technique utilizes on-package capacitance in the form of multiple power/ground plane layers on the package. This technique uses either solid or mesh power and ground planes, in either ceramic or organic packages. As with the technique that utilizes on-package bypass capacitance, the frequency response of the network formed by the die attach, the package via inductances, the package trace and plane inductances, and the self inductance of the capacitor formed by the planes is not well matched to the frequency content of the incident on-die event, and thus, is inadequate for handling the sharp peaks of the incident on-die event.

A technique implemented with printed circuit boards (PCBs) for reducing power noise utilizes on-board bypass capacitance, implemented either as discrete capacitors or as power/ground planes within the PCB or a combination of both. The frequency limitations discussed above are also inherent in this technique and are further exacerbated by additional inductance resulting from the chip-to-board package attach, the board via inductance, and the power-plane perforations.

Another known technique for reducing power noise and EMI in ICs utilizes intrinsic on-die capacitance formed by non-switching gates. The frequency response of the on-die capacitance formed by the non-switching gates is well matched to the incident power events by virtue of the fact that both are instantiated in the same material using the same connections. The primary problem associated with using intrinsic on-die capacitance is that the ratio of switching to non-switching gates is large in an efficient VLSI (very large scale integrated) circuit design. As utilization of the die area becomes more efficient, less capacitance will be available from non-switching gates because a larger percentage of the gates will be switching. Therefore, the number of non-switching gates available for capacitance is self-limiting.

Another known technique for reducing power noise and EMI on ICs utilizes extrinsic, or specifically instantiated, on-die capacitance. Although these capacitors provide a source of charge to supply on-die demands, which is well matched to the frequency content of the incident event, they do not provide a damping element. The resultant undamped power oscillations on package and die power structures can seriously degrade IC performance if they are co-incident with successive IC power events. The end result is super-positioning of resonant events with incident events, resulting in an overall higher noise amplitude at specific times.

On-package and on-die capacitance without loss elements must be carefully designed and implemented in order to avoid overlapping resonant frequencies, and the capacitances must be carefully chosen with regard to operating frequencies, package resonant frequencies, and board resonant frequencies. FIG. 2 shows a typical waveform for a CMOS power noise event on a die which has on-die capacitors without loss elements. Although the peak amplitude of the incident pulse is reduced when compared to that shown in FIG. 1, the under-damped power supply ringing causes sequential pulses to create a standing-wave condition with a specific frequency content. These undamped power oscillations can seriously degrade IC performance if they are co-incident with successive IC power events.

Accordingly, a need exists for a method and apparatus which is effective in reducing power noise and associated EMI in integrated circuit chips.

SUMMARY OF THE INVENTION

The present invention provides a method and apparatus for reducing noise in ICs which utilize on-die capacitance in conjunction with one or more resistive loss elements to provide an AC termination for on-die power events. In accordance with the present invention, the on-die capacitance can be instantiated in metal layers alone, in gate oxides, or in gate oxides combined with metal structures. The on-die capacitance can be instantiated using any suitable technique. The on-die capacitance can be any type of capacitance that is available using current IC fabrication processes or IC fabrication processes that become available in the future. The resistive loss elements can be instantiated using any suitable technique. Preferably, the resistive loss elements are instantiated either by using a linear resistance of thin lines on metal layers, or by placing one or more discrete field effect transistors (FETs) in series with a formed capacitor. The resistive loss element can be any type of resistive element that is available using current IC fabrication processes or IC fabrication processes that become available in the future.

By utilizing on-die capacitance in conjunction with a resistive loss element, the IC is provided with loss characteristics and power filter characteristics which are effective in reducing power noise and EMI. In accordance with the preferred embodiment of the present invention, the loss characteristics and power filter characteristics of the power distribution structure of the IC can be tuned during the design process by varying the resistive values (R) and the capacitive values (C) in order to achieve maximum noise reduction and optimum performance.

Other features and advantages of the present invention will become apparent from the following discussion, drawings and claims.

BRIEF DESCRIPTION OF THE DRAWINGS

FIG. 3 illustrates an isometric view of a first embodiment of the present invention wherein the on-die capacitance and resistive loss element of the present invention are comprised by a series resistance of a metal line and the parallel capacitance formed by alternating ground and power metal layers.

FIGS. 4A–4C illustrate top plan views of three different embodiments of the on-die AC loss element of the present invention wherein each embodiment produces different AC loss and power filter characteristics.

DETAILED DESCRIPTION OF THE INVENTION

I. Preferred Embodiments Of The AC Loss Element

FIG. 3 is an isometric view of a first embodiment of the present invention wherein the on-die capacitance and resistive loss element of the present invention, hereinafter collectively referred to as the AC loss element 1, are comprised by a series resistance of a metal line 2 and the parallel capacitance 5 formed by alternating ground metal layers 3 and power metal layers 4. The parallel capacitance 5 provides an AC connection of the resistive element formed by the metal line 2 to the power rails (not shown) when noise, e.g., AC transients, is present. However, the parallel capacitance 5 prohibits a DC connection of the metal line 2 to the power rail when noise is not present.

Generally, the characteristics of the AC loss element 1 are controlled in accordance with the present invention by manipulating the number of squares comprised by various portions of the IC power distribution structure. Resistivity is measured per unit square, which corresponds to an area have an aspect ratio (i.e., length-to-width ratio) of 1-to-1. In accordance with the present invention, it has been determined that the relative resistance and the relative capacitance of various portions of the power distribution structure can be varied by varying the number and/or overall area of the squares at different portions of the IC power structure. This feature of the present invention enables the loss characteristics and the power filter characteristics of the power distribution structure to be varied to maximize noise reduction and optimize IC performance. In essence, the width of the metal line 2, the line-to-line spacing, the line length-to-width aspect ratio, the number of the metal layers 3 and 4, the distance between the metal layers 3 and 4, and the dielectric material between the metal layers 3 and 4 are all tunable parameters which can be varied in order to achieve maximum noise reduction and to optimize IC performance.

Figure 1:
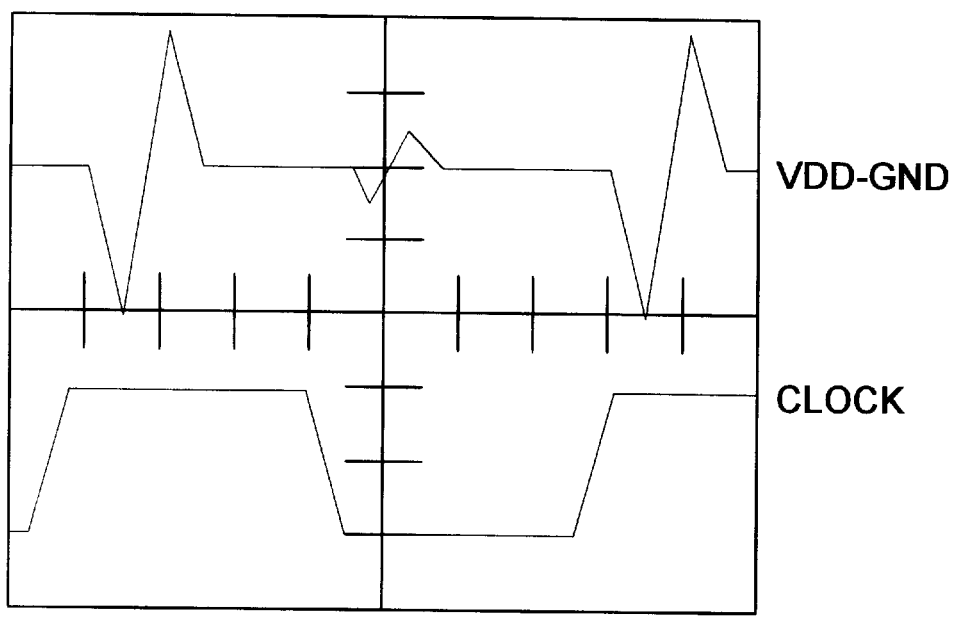
FIG. 1 illustrates a typical waveform for a CMOS power noise event on die.
Figure 2:
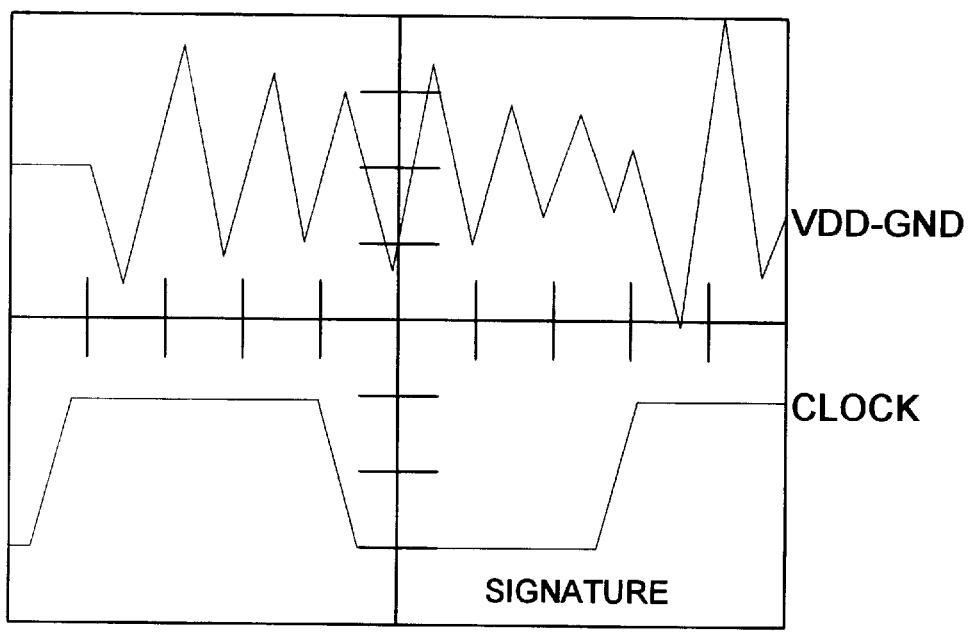
FIG. 2 illustrates a typical waveform for a CMOS power noise event on a die which has on-die capacitors without loss elements.
Figure 4C:
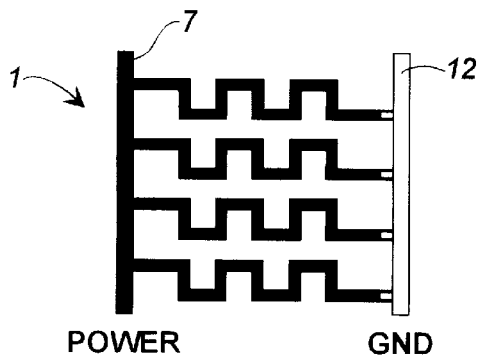

FIGS. 4A–4C illustrate top plan views of three different embodiments of the on-die AC loss element 1 of the present invention wherein each embodiment produces different AC loss and power filter characteristics. The AC loss element 1 of FIG. 4A is comprised of the alternating VDD and ground metal layers shown in FIG. 3. Only the VDD metal layer 4 can be seen in FIG. 4A. Also, only the VDD rail 7 of the power distribution structure is shown in FIG. 4A. The ground rail is underneath and separated from the VDD rail 7 and therefore cannot be seen in FIG. 4A.

FIG. 4A is characterized by relatively high resistance and relatively low capacitance. This is indicated by the long serpentine upper metal layer 4 and bottom metal layer (not shown), which results in a relatively high resistance and a relatively low capacitance. The serpentine structure 11 is comprised of many small squares connected in series. Due to the small area of the squares, the resistance of the serpentine structures 11 is relatively high and the capacitance is relatively low. Therefore, the AC loss element of the present invention shown in FIG. 4A exhibits relatively high loss characteristics.

The AC loss element 1 of FIG. 4B also incorporates the structure of the alternating metal layers shown in FIG. 3. The AC loss element illustrated in FIG. 4B is characterized by a relatively high capacitance and a relatively low resistance, which means that it exhibits a relatively low loss. This is indicated by the short length of serpentine portion formed by the upper metal layer 4 and the lower metal layer (not shown) and by the large surface area of rectangular portion 9. Actually the rectangular portion 9 is fed by the serpentine structure 11 in the center of the rectangular portion 9, creating the effect of two squares connected in parallel. Since capacitance is, in part, a function of area, the increased area of the two squares forming the rectangular portion 9 results in a relatively high capacitance. Therefore, the AC loss element of the present invention shown in FIG. 4B is characterized by a relatively low loss.

FIG. 4C illustrates another embodiment of the AC loss element of the present invention wherein the structure of the alternating metal layers 3 and 4 shown in FIG. 3 is not necessarily used. FIGS. 3–4B illustrate the alternating ground and VDD metal layers 3 and 4 which is often available on ICs. However, where this alternating structure is not necessarily available, the ground metal layer 3 will not necessarily always be in the die layer beneath the die layer in which the VDD metal layer 4 is disposed. FIG. 4C illustrates the latter case wherein the ground rail 12 is not disposed underneath the VDD rail 7.

Figure 4D:
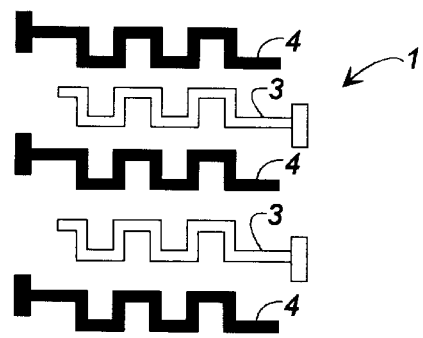
FIG. 4D is a modified view of FIG. 4C that shows that the metal layers 4 do not come into contact with the ground rail 12 and that the metal layers 3 do not come into contact with the power rail 7.

As with the embodiment of FIG. 4A, the AC loss element shown in FIG. 4C is characterized by high resistance and low capacitance due to the serpentine structure of the ground and VDD metal layers 3 and 4, respectively, thereby resulting in an AC loss element which exhibits high loss characteristics. FIG. 4D is a modified view of FIG. 4C. In the modified view of FIG. 4D, the ground metal layers 3 that are actually disposed below the VDD metal layers 4 are illustrated as being beside the VDD metal layers 4. This view is intended to illustrate that the ends of the ground metal layers 3 that are closest to the power rail 7 do not come into contact with the power rail 7. Similarly, the end of the VDD metal layers 4 that are closest to the ground rail 12 do not come into contact with the ground rail 12.

Figure 5:
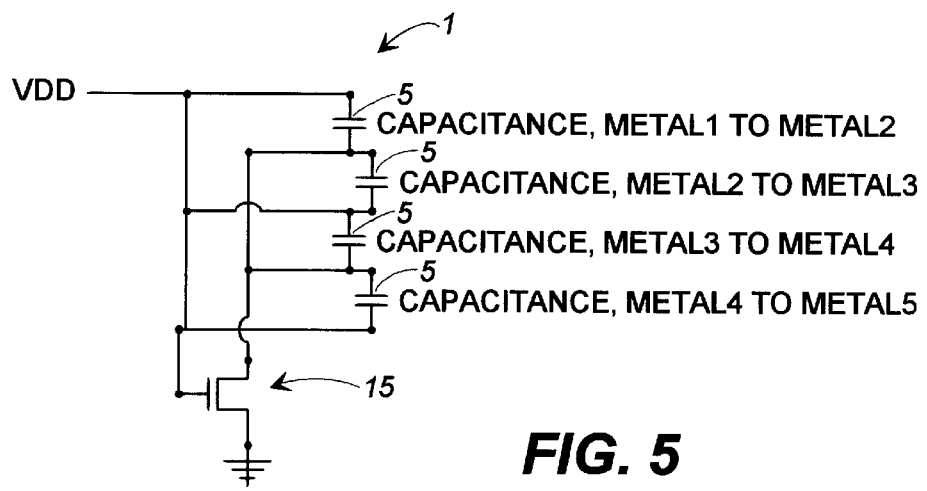
FIG. 5 illustrates an alternative embodiment of the present invention wherein the AC loss element of the present invention comprises the inter-layer capacitances created by the ground and VDD metal layers shown in FIG. 3, in series with one or more FET devices.

FIG. 5 illustrates an alternative embodiment of the present invention wherein the AC loss element 1 of the present invention comprises the inter-layer capacitances 5 created by the ground and VDD metal layers 3 and 4, respectively, as shown in FIG. 3, in series with one or more FET devices 15. Although only one FET device 15 is shown in FIG. 5, it will be understood by those skilled in the art that the number of FET devices implemented will depend on the desired resistivity, which, in accordance with the present invention, is a tunable parameter. Also, the resistance of the FET device(s) 15 can be tuned as a function of transistor length and width, as will be understood by those skilled in the art. The capacitance of the multi-layer metal structure formed by the metal layers 3 and 4 can be tuned as a function of total area per layer, number of layers, dielectric material, metal material, and dielectric thickness, etc.

Figure 6:
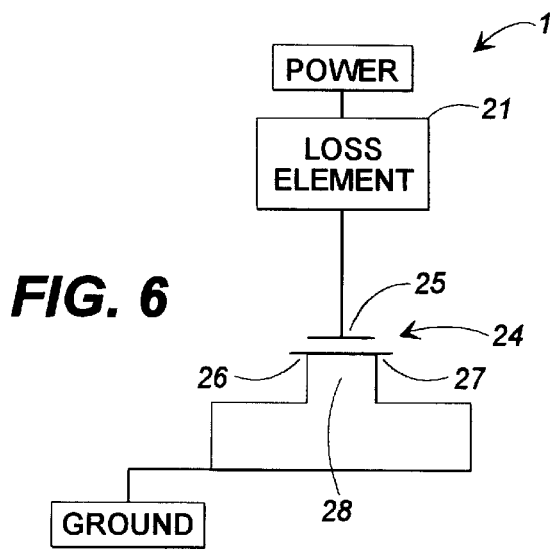
FIG. 6 illustrates an alternative embodiment of the present invention wherein the AC loss element comprises one or more MOSFETs in series with a resistive loss element

FIG. 6 illustrates an alternative embodiment of the AC loss element 1 of the present invention wherein a resistive loss element 21 is connected in series with a MOSFET device 24. Although only one MOSFET device 24 is shown in FIG. 6, this is for ease of illustration. Preferably, a plurality of MOSFET devices are disposed in parallel with one another and the parallel configuration is in series with the resistive loss element 21. This embodiment utilizes the gate-to-channel capacitance of the MOSFET, which preferably is an N-channel MOSFET, as the capacitance element of the AC loss element 1 of the present invention. A significant parasitic resistance is associated with each MOSFET as a result of the resistance in the gate electrode 25, the resistance in the drain 26 and source 27 electrodes, and the resistance in the channel region 28. These parasitic resistances can be tuned by varying the number and location of the connections to the gate 25, the drain 26 and the source 27 of the MOSFET 24.

It should be noted that the resistive loss element is not limited to any particular type of element. For example, instead of using properly formed metalization or an FET as the resistive loss element, any other element available in the IC fabrication process which has suitable resistance and current carrying properties may be used as the resistive loss element. The resistive loss element may be, for example, a doped region in the substrate, the gate conductor material, the via fill material, and/or the local interconnect material. Those skilled in the art will understand the manner in which such doping can be accomplished to produce the desired resistance values.

One of the primary advantages of utilizing on-die capacitance with loss elements is that the frequency response of the capacitive structure is well-matched to the frequency content of the incident event, but without the ringing associated with under-damped networks formed with intrinsic and extrinsic on-die capacitance. Another advantage is that the path between the demand for charge and source of charge is a very short, low-inductance path, resulting in efficiencies which are not obtainable using the prior art on-package and/or on-board capacitance prior art designs.

Also, since, in accordance with the present invention, the source of charge and the damping element are contained on-die, high di/dt current noise radiating from package pins is greatly reduced, thereby resulting in reduced ground bounce, reduced power plane noise on the board and on the package, and reduced EMI. This feature of the present invention allows less expensive IC packages to be used, while reducing costs associated with EMI shielding in noisy VLSI chips.

Furthermore, since the AC loss element 1 of the present invention is tunable, it can be tailored to the specific needs of a wide variety of VLSI designs, IC packages, and switching frequencies. Some examples of the manner in which this can be accomplished are provided below with respect to various types of ICs. Although some on-board bypass may still be desirable in some cases, the effectiveness of the AC loss element 1 of the present invention is increased by virtue of the fact that the noise events seen at the board have been attenuated by the AC loss element 1 and the highest frequency components have been removed by the AC loss element 1.

Noise penalties associated with simultaneous-switching events can also be greatly reduced by the AC loss element 1 of the present invention. Although the current path is still a loop containing off-chip elements, the high-frequency bypass formed by the instantiated on-die capacitances can form an effective AC short between power and ground on-die. This has the effect of making power and ground pins a parallel path for both a high-to-low and a low-to-high output transition. In a parallel configuration, the effective inductance of the pins can be greatly reduced. The loss associated with on-die capacitance in the I/O area of the IC can be tuned for best overall performance.

II. The Tunability Of The AC Loss Element

Optimum on-die power performance can be defined in a generic sense (i.e., noise voltages and current transients are reduced to very small amplitudes), but it can also be defined in a case-specific sense. The following examples demonstrate the manner in which the parameters of the AC loss element 1 of the present invention may be selected, or tuned, to optimize performance of an IC.

Core switching "brownout" or power sag in a specific area of the die relative to the simultaneous switching of many gates in a localized area can be reduced by tuning the AC loss element 1 of the present invention. For this case, tuning of the AC loss element 1 can be performed by simulating, preferably via a simulation program (e.g., a SPICE simulation program), the switching of specific gate types in the specific time delay profile (delta gate switch time, or "smear") at a specific frequency, with simulated values for on-die power distribution inductance and resistance. During the simulation, the values of resistance and capacitance are varied until the optimum point is reached.

First, a baseline is established using a 0-ohm value for the resistive loss element, and the resultant resonance is observed. The resistive loss element value is then increased and the reduction of the resonant amplitude is observed until the optimum point has passed. This point can be detected due to the fact that, beyond the optimum point, the resistive loss element takes on undesirable characteristics that can be observed. For example, observations can be made that the currents between the demand for charge and the source of charge have been limited to the point that the capacitor is rendered useless.

Likewise, the capacitance value can be varied within the range of values achievable within the desired IC process until the point of optimum performance has been observed.

If the capacitance value is too low, only minimal reduction of the power noise will be seen during simulation. If the capacitance value is too high, although still within values achievable in the IC process, the frequency response of the AC loss element will be lowered to the point that it no longer matches the frequency content of the initial noise event. Therefore, the capacitance value that best matches the frequency content of the noise event and that maximizes power noise reduction should be selected.

The AC loss element 1 of the present invention can also be tuned to maximize reduction of EMI in low-cost IC packages. In this case, EMI is caused by high di/dt currents in the power leads of inexpensive packages during core switching activity. This causes the power and ground rails on-die to vary significantly with respect to on-board power and ground levels, leading to a power noise signature being present on all pins of the package. The die noise is directly coupled into the power pins. The die noise is coupled into the output pins of the package primarily through low driver impedances. The die noise is coupled into the input pins of the package primarily through the Electro-Static Discharge (ESD) protection circuits commonly found on these types of ICs. In this case, the resonant frequency of the combined path formed by the die/die bond or attach/package/board and vias/board planes is an important factor in simulation, and the goal is to reduce the total di/dt currents in the leads at the desired frequency or range of frequencies of operation.

In accordance with the present invention, two preferred methods have been developed for determining the AC loss element resistance and capacitance in these types of ICs. The first method translates the problem to an on-die-only simulation, and simulates toward a goal of reduced di/dt currents at the power attach points. This method assumes that reduced di/dt currents will result in reduced EMI. Package and board effects are not taken into account in this simulation. One of the advantages of this approach is that it greatly simplifies the simulation requirements and reduces the total number of simulation models required.

The second method utilizes a more complex simulation wherein package and board effects are taken into account. One of the advantages of this approach is that it is less likely to result in a resonant package structure due to the fact that it takes package and board effects into consideration when the simulation is performed. However, this method is also more time consuming and requires accurate models of the IC package, the die attach or bond wires, the board vias, the board plane structures, and the on-board capacitances.

The AC loss element of the present invention can also be used to reduce switching effects in Simultaneously Switching Outputs (SSO). It is well known that multiple output drivers switching in phase at the same time can cause power rail collapse and/or ground bounce on the die. Since the primary current path is off-chip in these situations, it is often assumed that on-die capacitance can have no effect on SSO noise. This assumption is valid for many cases, but not for all cases.

In cases involving very fast rise times (e.g., less than 300pS) and very large packages (e.g., greater than 1000 pin count), the duration of the rise time is often less than the round-trip time for the current loop through the package traces. Thus, the off-chip bypass capacitance is located a significant electrical distance from the demand for charge. As a result, when multiple I/O ports switch from a low state to a high state, a large current is seen in the power pins of the package, and a small current is seen in the ground pins of the package for a brief period of time. The impedance of the power pin network often causes a supply rail collapse, resulting in degraded switching performance of the outputs.

Likewise, when multiple I/O ports switch from a high state to a low state, a large current is seen in the ground pins of the package, and a small current is seen in the power pins of the package for a brief period of time. The impedance of the ground pin network causes a ground rail bounce, resulting in degraded switching performance of the outputs. On-die capacitance placed in the I/O structures of the IC can form an AC shorting mechanism, which is sufficient to cause the power and ground pins to be coupled in parallel for both high-to-low and low-to-high transitions. The parallel paths offer essentially ½ of the impedance of either considered separately, thus reducing the rail collapse, ground bounce, and resultant degraded output performance.

In accordance with the present invention, tuning of the AC loss element 1 for this case may be different than for other cases because excessive resistance in the AC loss element 1 may significantly reduce the effectiveness of the AC short formed by the on-die capacitance. Conversely, a lack of resistance in this area can result in a power circuit which resonates relative to the frequency content of the output transition, and thus further degrades the output switching performance, or causes secondary switching effects, such as output ringing. Tuning for this case can be performed by using simulation to determine the optimum capacitance and resistance values. The simulation is performed using a model of the power distribution, the package or a subset of the package, the output driver, the off-package signal loading, and off-chip power distribution, including bypass capacitors. A range of values are simulated, and optimum values are selected on the basis of output switching performance.

The AC loss element of the present invention can also be tuned for whole-die performance. In this case, there is less need for improvement of power noise reduction in specific areas, and more need for improvement of power noise reduction over the entire die. As in the cases discussed above, a simulation is created, but in this case it contains an appropriate set of switching currents to represent core and I/O switching activity. Assuming that the on-die capacitance and loss elements are somewhat evenly distributed on die, and that there are no large localized power or ground rail impedances, a subset of the die can be modeled with a subset of the AC loss element 1 of the present invention. In this case, package effects should be considered to avoid creating a resonant structure. The package effects can be complex for a high accuracy/low risk solution, or they may be simplified, understanding that there may be some risk of less overall accuracy of the simulation if they are simplified.

While preferred embodiments of the invention have been disclosed in detail in the foregoing description and drawings, it will be understood by those skilled in the art that variations and modifications can be made to these embodiments without departing from the spirit and scope of the present invention and that the present invention is not limited to the preferred embodiments.

What is claimed is:

1. An apparatus for reducing noise in integrated circuit chips, the apparatus comprising:

a capacitance element instantiated in a die of the integrated circuit chip, the capacitance element corresponding to portions of two or more metal layers instantiated in the die, the portions of the metal layers having a dielectric material between them, the metal layers being comprised by a power distribution structure of the integrated circuit; and a resistive loss element instantiated in the die, the resistive loss element corresponding to line resistance of one or more metal portions of one or more of the metal layers of the power distribution structure of the integrated circuit chip, the resistive loss element being in series with the capacitance element, wherein the coupling of the capacitance element and the resistive loss element form an AC loss element that reduces noise in the integrated circuit chip.

2. The apparatus of claim 1, wherein the resistive loss element has a relatively high resistance and the capacitance element has a relatively low capacitance such that the AC loss element exhibits relatively high loss characteristics.

3. The apparatus of claim 1, wherein the resistive loss element has a relatively low resistance and the capacitance element has a relatively high capacitance such that the AC loss element exhibits relatively low loss characteristics.

4. The apparatus of claim 1, wherein the capacitance element and the resistive loss element have values that are selected to maximize noise reduction in the integrated circuit.

5. A method for reducing noise in an integrated circuit chip, the method comprising the steps of:

instantiating a capacitance element in a die of the integrated circuit chip, the capacitance element corresponding to portions of two or more metal layers instantiated in the die, the portions of the metal layers having a dielectric material between them, the metal layers being comprised by a power distribution structure of the integrated circuit; and instantiating a resistive loss element in the die, the resistive loss element being coupled in series with the capacitance element, the resistive loss element corresponding to line resistance of one or more metal portions of one or more of the metal layers of the power distribution structure of the integrated circuit chip, the resistive loss element being in series with the capacitance element, wherein the coupling of the capacitance element and the resistive loss element form an AC loss element that reduces noise in the integrated circuit chip.

6. The method of claim 5, wherein the resistive loss element has a relatively high resistance and the capacitance element has a relatively low capacitance such that the AC loss element exhibits relatively high loss characteristics.

7. The method of claim 5, wherein the resistive loss element has a relatively low resistance and the capacitance element has a relatively high capacitance such that the AC loss element exhibits relatively low loss characteristics.

8. The method of claim 5, wherein, prior to the step of instantiating the resistive loss element in the die, a value of the resistive loss element that results in maximum noise reduction in the integrated circuit chip when instantiated in the die and coupled with the capacitance element is selected.

9. The method of claim 8, wherein the step of selecting the value for the resistive loss element includes performing a simulation of the integrated circuit chip during operation using a plurality of different values for the resistive loss element to determine which value for the resistive loss element results in maximum noise reduction when instantiated in the die and coupled with the capacitance element.

10. The method of claim 8, wherein, prior to the step of instantiating the capacitance element in the die, a value of the capacitance element that results in maximum noise reduction in the integrated circuit chip when instantiated in the die and coupled with the resistive loss element is selected.

11. The method of claim 10, wherein the step of selecting the value for the capacitance element includes performing a simulation of the integrated circuit chip during operation using a plurality of different values for the capacitance element to determine which value for the capacitance element results in maximum noise reduction when instantiated in the die and coupled with the resistive loss element.

12. An apparatus for reducing noise in integrated circuit chips, the apparatus comprising:

a capacitance element estantiated in a die of the integrated circuit chip, the capacitance element having a first terminal and a second terminal, the first terminal of the capacitance element being coupled to a power source; and a first resistive loss element estantiated in the die, the resistive loss element being a field effect transistor (FET), the FET having a gate, a source and a drain, the second terminal of the capacitance element being coupled to the source of the FET, the gate of the FET being coupled to the power source, the drain of the FET being coupled to ground, wherein the coupling of the capacitance element and the resistive loss element form an AC loss element that reduces noise in the integrated circuit.

13. A method for reducing noise in an integrated circuit chip, the method comprising the steps of:

instantiating a capacitance element in a die of the integrated circuit chip, the capacitance element having a first terminal and a second terminal, the first terminal being coupled to a power source; and instantiating a resistive loss element in the die, the resistive loss element being a field effect transistor (FET), the FET having a gate, a source and a drain, the source of the FET being coupled to the second terminal of the capacitance element, the gate of the FET being coupled to the power source and the drain of the FET being coupled to ground, wherein the coupling of the capacitance element and the FET form an AC loss element that reduces noise in the integrated circuit chip.

14. An apparatus for reducing noise in integrated circuit chips, the apparatus comprising:

a first resistive loss element, the first resistive loss element having a first terminal and a second terminal, the first terminal of the first resistive loss element being coupled to a power source; and a second resistive loss element, the second resistive loss element being a metal oxide semiconductor field effect transistor (MOSFET) connected in series with the first resistive loss element, the MOSFET having a gate, a source and a drain, the gate of the MOSFET being coupled to the second terminal of the first resistive loss element, wherein the MOSFET has a gate-to-channel capacitance associated therewith, and wherein the MOSFET has a parasitic resistance associated therewith, and wherein the coupling of the first resistive loss element and the second resistive loss element forms an AC loss element that reduces noise in the integrated circuit chip.

15. The apparatus of claim 14, wherein the gate-to-channel capacitance of the MOSFET is relatively low and wherein the first resistive loss element has a relatively high resistance, the relatively high resistance of the first resistive loss element and the relatively low capacitance of the MOSFET causing the AC loss element to exhibit relatively high loss characteristics.

16. The apparatus of claim 14, wherein the gate-to-channel capacitance of the MOSFET is relatively high and wherein the resistive loss element has a relatively low resistance and wherein the relatively high capacitance of the MOSFET and the relatively low resistance of the resistive loss element cause the AC loss element to exhibit relatively low loss characteristics.

17. A method for reducing noise in an integrated circuit chip, the method comprising the steps of instantiating a first resistive loss element in a die of the integrated circuit chip, the first resistive loss element including a first terminal and a second terminal, the first terminal of the first resistive loss element being coupled to a power source; and instantiating a second resistive loss element in the die, the second resistive loss element being a metal oxide semiconductor field effect transistor (MOSFET) connected in series with the first resistive loss element, the MOSFET having a gate, a source and a drain, the gate of the MOSFET being coupled to the second terminal of the first resistive loss element, the MOSFET being connected in series with the first resistive loss element, the MOSFET having a gate-to-channel capacitance, the gate-to-channel capacitance of the MOSFET forming a capacitance element in the integrated circuit chip, wherein the MOSFET has a parasitic resistance associated therewith, the combination of the first resistive loss element, the parasitic resistance of the MOSFET, and the gate-to-channel capacitance of the MOSFET form the AC loss element that reduces noise in the integrated circuit chip.

* * * * *